United States Patent
Kim et al.

(10) Patent No.: US 8,168,300 B2
(45) Date of Patent: *May 1, 2012

(54) BLACKENED ELECTROMAGNETIC INTERFERENCE SHIELD GLASS AND METHOD OF PRODUCING THE SAME

(75) Inventors: Seung-Wook Kim, Yongin-si (KR); Dong-Wook Lee, Daejeon Metropolitan (KR); Sang-Ki Chun, Daejeon Metropolitan (KR); In-Seok Hwang, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 130 days.

This patent is subject to a terminal disclaimer.

(21) Appl. No.: 12/450,507

(22) PCT Filed: Apr. 2, 2008

(86) PCT No.: PCT/KR2008/001853
§ 371 (c)(1),
(2), (4) Date: Sep. 29, 2009

(87) PCT Pub. No.: WO2008/120952
PCT Pub. Date: Oct. 9, 2008

(65) Prior Publication Data
US 2010/0109978 A1    May 6, 2010

(30) Foreign Application Priority Data
Apr. 3, 2007 (KR) .................. 10-2007-0032871

(51) Int. Cl.
*B32B 15/00* (2006.01)
*B32B 17/06* (2006.01)
(52) U.S. Cl. ........ 428/432; 428/433; 428/434; 428/689; 428/699; 428/701; 428/702
(58) Field of Classification Search .............. 428/432, 428/433, 434, 689, 699, 701, 702
See application file for complete search history.

(56) References Cited

U.S. PATENT DOCUMENTS
2004/0222003 A1* 11/2004 Kim et al. .................. 174/35 R

FOREIGN PATENT DOCUMENTS
| JP | 2000-260336 A | 9/2000 |
| JP | 2002-057490 | 2/2002 |
| JP | 2002-271086 | 9/2002 |
| KR | 10-2004-0085762 | 10/2004 |
| KR | 10-2007-0001432 | 1/2007 |
| WO | WO 2008/062920 | * 5/2008 |

* cited by examiner

Primary Examiner — Gwendolyn Blackwell
(74) Attorney, Agent, or Firm — McKenna Long & Aldridge LLP

(57) ABSTRACT

The present invention provides a method of producing an electromagnetic interference shield glass, which comprises (a) forming a conductive pattern on at least one side of a front side and a rear side of the glass by using a conductive paste comprising a colored glass frit, and (b) firing the conductive pattern to blacken the conductive pattern, and a blackened electromagnetic interference shield glass.

6 Claims, No Drawings

BLACKENED ELECTROMAGNETIC INTERFERENCE SHIELD GLASS AND METHOD OF PRODUCING THE SAME

TECHNICAL FIELD

The present invention relates to a method of producing an electromagnetic interference shield glass wherein low specific resistance is maintained in order to sufficiently show an electromagnetic interference shield function and contrast of a display device is not affected due to blackening treatment, and an electromagnetic interference shield glass that is produced by using the same.

This application claims priority from Korea Patent Application No. 10-2007-32871 filed on Apr. 3, 2007 in the KIPO, the disclosure of which is incorporated herein by reference in its entirety.

BACKGROUND ART

In the related art, in order to shield the harmful electromagnetic wave from the PDP, a mesh pattern that is made of a copper material is manufactured by using a photolithography process. However, since the photolithography process is complicated and the cost of the raw material is high, the production cost is high and is most costly in respects to raw material of the PDP filter. However, since the competition of PDPs and LCDs is deepened in a FPD (Flat Panel Display) market, it is required to develop a low-priced raw material, and a technology has been developed to print a mesh pattern by using a conductive paste through a printing process such as a screen printing process, an offset printing process or the like.

It is necessary to sufficiently reduce the specific resistance of the conductive paste that is used to perform the printing so that the characteristics of the electromagnetic interference shield film produced by using the printing process are sufficiently realized.

In order to achieve this, the use of the conductive paste comprising the metal powder has been developed. However, when the conductive pattern is printed by using conductive paste according to the offset printing process, light from the PDP and external light is reflected due to a gloss of metal, which negatively affects contrast. Therefore, there is a need to perform the blackening treatment of the conductive pattern.

DISCLOSURE OF INVENTION

Technical Problem

It is an object of the present invention to provide a method of producing an electromagnetic interference shield glass, which can easily blacken a conductive pattern formed on a glass substrate by using a printing method, and a blackened electromagnetic interference shield glass.

It is another object of the present invention to provide a PDP filter that is produced by additionally attaching an anti-reflection film, a near infrared ray shielding film, a color correction film or the like to a blackened electromagnetic interference shield glass, and a PDP device comprising the same.

Technical Solution

In order to accomplish the above objects, the present invention provides a method of producing an electromagnetic interference shield glass in which an interface between a conductive pattern and a glass substrate is blackened through a firing process to fix the conductive pattern without a separate blackening treatment and an increase in surface resistance.

That is, a film type of electromagnetic interference shield unit is not used and a electromagnetic interference shield unit is directly formed on a surface of glass, so as to simplify a structure or a production process. In particular, a firing process is sufficiently performed while a firing temperature is freely controlled without the limit of the firing temperature. Thus, it is possible to provide a blackened electromagnetic interference shield glass that comprises the electromagnetic interference shield unit having the optimum conductivity, and a method of producing the same.

Advantageous Effects

According to the present invention, there is provided an electromagnetic interference shield glass and a method of producing the same, in which an interface between a printed conductive pattern and a glass substrate is blackened without an increase in surface resistance to avoid a problem of contrast caused by a luster of metal.

In addition, since a blackening treatment is performed during a firing process to fix a conductive pattern on the glass substrate, a separate blackening process is unnecessary. Thus, an improvement in the productivity can be achieved through the simplification of the production process and the device of the electromagnetic interference shield glass.

BEST MODE FOR CARRYING OUT THE INVENTION

The present invention provides a method of producing a blackened electromagnetic interference shield glass, which comprises (a) forming a conductive pattern on at least one side of a front side and a rear side of glass by using a conductive paste, and (b) firing the glass on which the conductive pattern is formed.

The type of conductive paste is not limited, but the conductive paste may comprise one or more metal powders selected from the group consisting of copper, silver, gold, and aluminum, an organic binder resin solution in which a polymer binder is dissolved in an organic solvent, and a glass frit that is used to improve an adhesion strength between a paste and a glass substrate. In particular, it is preferable to use the conductive paste that comprises a silver (Ag) component having excellent electric conductivity and low specific resistance as a metal component and the colored glass frit for blackening treatment.

It is preferable that the conductive paste comprise 70 to 90 wt % of metal powder, 0.1 to 15 wt % of colored glass frit, and 5 to 30 wt % of organic binder resin solution (it means the solution in which the polymer binder is dissolved in the organic solvent, and the amount of the polymer binder is in the range of 3 to 20 wt % of the total weight of the organic solvent and the polymer binder).

The conductive paste may be prepared, for example, by adding the colored glass frit, and the metal powder after the polymer binder is dissolved in the organic solvent to prepare the organic binder resin solution, kneading them, and uniformly dispersing the agglomerated metal powder and glass frit by using a three-stage roll mill.

It is preferable that the organic solvent be selected from the group consisting of butyl carbitol acetate, carbitol acetate, cyclohexanone, cellosolve acetate, terpineol, and diethylene glycol monobutyl ether.

The polymer binder functions to maintain the shape of the conductive pattern when the conductive pattern is formed by using the conductive paste, and a cellulose resin, an acryl resin, a vinyl resin and the like may be used.

If the conductive pattern is formed on the glass substrate and then fired at the temperature in the range of 400 to 700°

C., the glass frit that is uniformly added to the paste is melted at a predetermined temperature or more to move toward the glass substrate and be fused, thus improving the adhesion strength between the conductive paste and the glass substrate. In the case of when the temperature is less than 400° C., there is a problem in that the metal powder that is contained in the conductive paste, for example, the silver component, is melted to be fused on the glass substrate. In the case of when the temperature is more than 700° C., a distortion point is formed according to the bending or the surface unevenness of the glass. Thus, it is difficult to use the paste for displays.

In addition, the glass substrate on which the conductive pattern is formed is fired at preferably in the range of 500 to 700° C. so as to satisfy the condition of the tempered glass.

The firing time may be reduced as the firing temperature is increased, and in the range of about 3 to 30 min and preferably in the range of about 3 to 10 min in consideration of the productivity.

When the conductive pattern is formed by using the conductive paste comprising the metal component, light on the PDP module or external light is reflected due to a gloss of metal, which negatively affects the contrast. Thus, in order to avoid this, it is required to perform the blackening treatment. A printing process may be performed wherein carbon black or the black dye is added to the conductive paste to make the paste black. However, the specific resistance of the carbon black is high as compared to silver, and the black dye is non-conductive. Accordingly, the carbon black or the dye acts as an impurity in the paste, thus causing an increase in surface resistance of the final product and problems in performance of the electromagnetic interference shield.

According to the present invention, the conductive paste that comprises the colored glass frit is produced, printed on the glass substrate to form the conductive pattern, and fired at a high temperature to blacken the interface between the conductive pattern and the glass substrate without an increase in surface resistance.

The coloring component is not limited to the black color, and any color comprising an achromatic color such as a gray color or a brown color may be used as long as the color can cause the blackening effect while the color does not provide the sense of unwelcome to human.

In the colored glass frit, the coloring component such as $MnO_2$, $Fe_2O_3$, NiO, CoO, CuO and the like is colored on the typical glass frit. In the case of when the conductive paste to which the colored glass frit is added is fired, the glass frit is fluidized and thus moved toward the surface of the glass substrate due to the gravity. In connection with this, the coloring component may be moved in conjunction with the fluidized glass fit toward the surface of the glass substrate to make the interface between the conductive paste and the glass substrate black. In addition, since the coloring component is not uniformly distributed in the conductive paste, an increase in the surface resistance doe not occur.

In the above (a), the conductive pattern may be formed by using a printing process. A process of printing the conductive pattern on the surface of the glass may be selected from the group consisting of an offset printing process, a screen printing process, a gravure printing process, and an inkjet printing process, but is not limited thereto. Any printing process that is known in the art may be used as long as the printing can be directly performed on the surface of the glass.

In connection with this, the offset printing process comprises filling a concave part of a flat plate that comprises concave and convex parts with the conductive paste; bringing the flat plate into contact with a printing blanket to transfer the conductive paste from the concave part of the flat plate to the printing blanket; and bringing the printing blanket into contact with a surface of a glass to transfer the conductive paste from the printing blanket to the surface of the glass to form the electromagnetic interference shield unit having the conductive pattern. In connection with this, the conductive paste may be transferred onto the surface of the glass by using the convex part instead of the concave part according to a typical offset printing process.

Another embodiment of the present invention provides an electromagnetic interference shield glass that comprises a glass, and a conductive pattern that is formed on at least one side of a front side and a rear side of the glass and comprises a colored glass frit. An interface between the conductive pattern and the glass substrate is blackened by firing the glass on which the conductive pattern is formed.

Still another embodiment of the present invention provides a PDP filter that comprises the electromagnetic interference shield glass, and at least one film that is selected from the group consisting of an anti-reflection film, a near infrared ray shielding film, and a color correction film.

In addition, a further embodiment of the present invention provides a PDP device that comprises the PDP filter.

Mode for the Invention

A better understanding of the present invention may be obtained in light of the following Examples which are set forth to illustrate, but are not to be construed to limit the present invention.

Example: Production of the Electromagnetic Interference Shield Glass Blackened by Using the Black Glass Frit (1) Preparation of the Conductive Paste Ethyl cellulose that was the polymer binder was dissolved in butyl carbitol acetate so that the total weight of ethyl cellulose and butyl carbitol acetate was 10 wt % to prepare an organic binder resin solution. The weight of the organic binder resin solution was 20 wt % based on the total weight of the paste. The colored glass frit that had the basic composition of $Bi_2O_3$—$ZnO$—$B_2O_3$ and comprised CoO as the coloring component was added to the organic binder resin solution in an amount of 5 wt % based on the total weight of the paste, the silver powder was added to the organic binder resin solution in an amount of 75 wt % based on the total weight of the paste, and the kneading was performed. Next, the agglomerated silver powder and glass frit were uniformly dispersed by using a three-stage roll mill, and it was confirmed that the paste dispersed by using the roll mill had the shape. Subsequently, the resulting paste was recovered.

(2) Printing and Firing of the Conductive Pattern

The silver paste that was prepared by using the above method was applied on the glass substrate by using the engraving offset printing process to form the conductive pattern, fired at 600° C. for 10 min, and cooled to normal temperature to produce the electromagnetic interference shield glass having the blackened conductive pattern.

(3) Evaluation of the Blackening Degree and the Surface Resistance

In respects to the products that were produced in Example, the surface resistance and the blackening degree were evaluated. In respects to the surface resistance, the surface resistance was obtained by using MCP-T600 manufactured by Mitsubishi Chemical, Co., Ltd., the blackening degree L was obtained by calculating the L value from the reflectivity after the reflectivity of the conductive pattern was measured by using UV-3600 manufactured by Shimadzu, Corp., and the results are described in Table 1.

COMPARATIVE EXAMPLE 1

Production of the Electromagnetic Interference Shield Glass Without the Blackening Treatment The conductive paste was prepared by using the same process as Example, except that the black glass frit was not added but the typical glass frit having the basic composition of $Bi_2O_3$—$ZnO$—$B_2O_3$ was added during the preparation of the conductive paste.

In addition, the conductive pattern was formed on the surface of the glass by using the prepared conductive paste according to the same printing process as that of Example, and then fired. Then, the blackening degree and the surface resistance were measured by using the same method as Example.

The results are described in Table 1 in conjunction with the results of Example.

COMPARATIVE EXAMPLE 2

Production of the Electromagnetic Interference Shield Glass with the Blackening Treatment by Using the Black Pigment The conductive paste was prepared by using the same process as Example, except that the black glass frit was not added but the typical glass frit having the basic composition of $Bi_2O_3$—$ZnO$—$B_2O_3$ and CoO as the black pigment were added during the preparation of the conductive paste. With respect to the ratio, the content of the organic binder resin solution was 15 wt %, the content of the glass frit was 5 wt %, the content of CoO was 5 wt %, and the content of the silver powder was 75 wt %.

In addition, the conductive pattern was formed on the surface of the glass by using the prepared conductive paste according to the same printing process as that of Example, and then fired. Then, the blackening degree and the surface resistance were measured by using the same method as Example.

The results are described in Table 1 in conjunction with the results of Example.

Table 1

TABLE 1

|  | Surface resistance ($\Omega/\square$) | Blackening degree (L) |
| --- | --- | --- |
| Example | 0.1 | 29.0 |
| Comparative Example 1 | 0.1 | 51.0 |
| Comparative Example 2 | 0.3 | 31.0 |

As shown in Table 1, in the case of the electromagnetic interference shield glass according to the present invention, the surface resistance was 0.1 $\Omega/\square$, and the blackening degree L was 29.0 (the lower the blackening degree L is, the more black the glass is). That is, in the case of the electromagnetic interference shield glass that was produced in Comparative Example 1, since the conductive pasts having the different glass frits were used, the surface resistance was 0.1 $\Omega/\square$ which was not changed. However, it could be seen that the blackening degree L was increased by about 2 times as compared to Example. In addition, in the case of when the blackening treatment was performed by using the black pigment of Comparative Example 2, the blackening degree L was similar to that of Example. However, since the black pigment acted as the impurity, even though the weights of the powders of Example and Comparative Example were the same as each other in terms of wt %, it could be seen that the surface resistance was increased to 0.3 $\Omega/\square$ by 3 times.

Therefore, in the case of the electromagnetic interference shield glass that is subjected to the blackening treatment according to the present invention, it can be seen that the blackening degree is significantly increased without an increase in the surface resistance.

The invention claimed is:

1. An electromagnetic interference shield glass comprising:
    a glass; and
    a conductive pattern that is formed on at least one side of a front side and a rear side of the glass,
    wherein the conductive pattern is formed by using a conductive paste which comprises
        70 to 90 wt % of silver powder,
        0.1 to 15 wt % of colored glass frit having a basic composition of $Bi_2O_3$—$ZnO$—$B_2O_3$, and
        5 to 30 wt % of organic binder resin solution in which a polymer binder is dissolved in an organic solvent, and the amount of the polymer binder is in the range of 3 to 20 wt % of the total weight of the organic solvent and the polymer binder, and
    wherein an interface between the conductive pattern and the glass substrate is blackened by firing the glass on which the conductive pattern is formed at a temperature in the range of 400 to 700° C.

2. The electromagnetic interference shield glass as set forth in claim 1, wherein the organic solvent is selected from the group consisting of butyl carbitol acetate, carbitol acetate, cyclohexanone, cellosolve acetate, terpineol, and diethylene glycol monobutyl ether.

3. The electromagnetic interference shield glass as set forth in claim 1, wherein the conductive pattern is formed by using the printing process.

4. The electromagnetic interference shield glass as set forth in claim 1, wherein the firing of the glass on which the conductive pattern is formed is performed at the temperature in the range of 400 to 700° C.

5. A PDP filter comprising:
    the electromagnetic interference shield glass according to claim 1; and
    at least one film that is attached to a front side or a rear side of the electromagnetic interference shield glass and is selected from the group consisting of an anti-reflection film, a near infrared ray shielding film, and a color correction film.

6. A PDP device comprising a PDP filter according to claim 5.

* * * * *